(12) United States Patent
Smith

(10) Patent No.: US 6,881,523 B2
(45) Date of Patent: Apr. 19, 2005

(54) OPTICAL PROXIMITY CORRECTION METHOD UTILIZING RULED LADDER BARS AS SUB-RESOLUTION ASSIST FEATURES

(75) Inventor: Bruce W. Smith, Penfield, NY (US)

(73) Assignee: ASML Masktools B.V., Veldhoven (NL)

( * ) Notice: Subject to any disclaimer, the term of this patent is extended or adjusted under 35 U.S.C. 154(b) by 222 days.

(21) Appl. No.: 10/096,536

(22) Filed: Mar. 13, 2002

(65) Prior Publication Data

US 2002/0192570 A1 Dec. 19, 2002

Related U.S. Application Data

(60) Provisional application No. 60/275,723, filed on Mar. 14, 2001.

(51) Int. Cl.[7] .................................................. G03F 9/00
(52) U.S. Cl. .............................. 430/5; 430/30; 716/19; 716/20; 716/21
(58) Field of Search ..................... 430/5, 30; 716/19–21

(56) References Cited

U.S. PATENT DOCUMENTS

| | | | |
|---|---|---|---|
| 4,902,899 A | 2/1990 | Lin et al. | 250/492.1 |
| 5,229,255 A | 7/1993 | White | 430/311 |
| 5,229,872 A | 7/1993 | Mumola | 350/40 |
| 5,242,770 A | 9/1993 | Chen et al. | 430/5 |
| 5,256,505 A | 10/1993 | Chen et al. | 430/5 |
| 5,288,569 A | 2/1994 | Lin | 430/5 |
| 5,296,891 A | 3/1994 | Vogt et al. | 350/67 |
| 5,324,600 A | 6/1994 | Jinbo et al. | 430/5 |
| 5,362,584 A | 11/1994 | Brock et al. | 430/5 |
| 5,424,154 A | 6/1995 | Borodovsky | 430/5 |
| 5,436,095 A | 7/1995 | Mizuno et al. | 430/5 |
| 5,447,810 A | 9/1995 | Chen et al. | 430/5 |
| 5,523,193 A | 6/1996 | Nelson | 430/311 |
| 5,538,815 A | 7/1996 | Oi et al. | 430/5 |
| 5,585,210 A | 12/1996 | Lee et al. | 430/5 |
| 5,663,893 A | 9/1997 | Wampler et al. | 364/491 |
| 5,707,765 A | 1/1998 | Chen | 430/5 |
| 5,723,233 A | 3/1998 | Garza et al. | 430/5 |
| 5,821,014 A | 10/1998 | Chen et al. | 430/5 |
| 5,827,623 A | 10/1998 | Ishida et al. | 430/5 |
| 5,969,441 A | 10/1999 | Loopstra et al. | 310/12 |
| 6,114,071 A | 9/2000 | Chen et al. | 430/5 |
| 6,335,130 B1 * | 1/2002 | Chen et al. | 430/5 |
| 6,421,820 B1 * | 7/2002 | Mansfield et al. | 430/5 |

FOREIGN PATENT DOCUMENTS

| | | |
|---|---|---|
| EP | 0 770 926 A2 | 5/1997 |
| WO | WO 98/40791 | 9/1998 |

* cited by examiner

Primary Examiner—Mark F. Huff
Assistant Examiner—K. Sagar
(74) Attorney, Agent, or Firm—McDermott Will & Emery LLP

(57) ABSTRACT

A photolithography mask for optically transferring a pattern formed in said mask onto a substrate and for negating optical proximity effects. The mask includes a plurality of resolvable features to be printed on the substrate, where each of the plurality of resolvable features has a longitudinal axis extending in a first direction; and a pair of non-resolvable optical proximity correction features disposed between two of the plurality of resolvable features, where the pair of non-resolvable optical proximity correction features has a longitudinal axis extending in a second direction, wherein the first direction of the longitudinal axis of the plurality of resolvable features is orthogonal to the second direction of the longitudinal axis of the pair of non-resolvable optical proximity correction features.

23 Claims, 10 Drawing Sheets

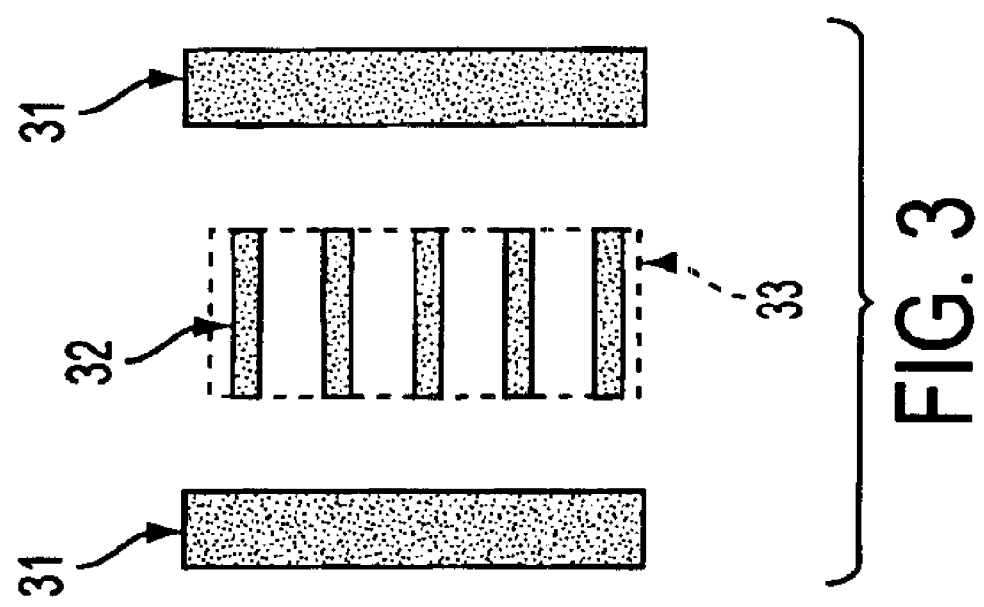

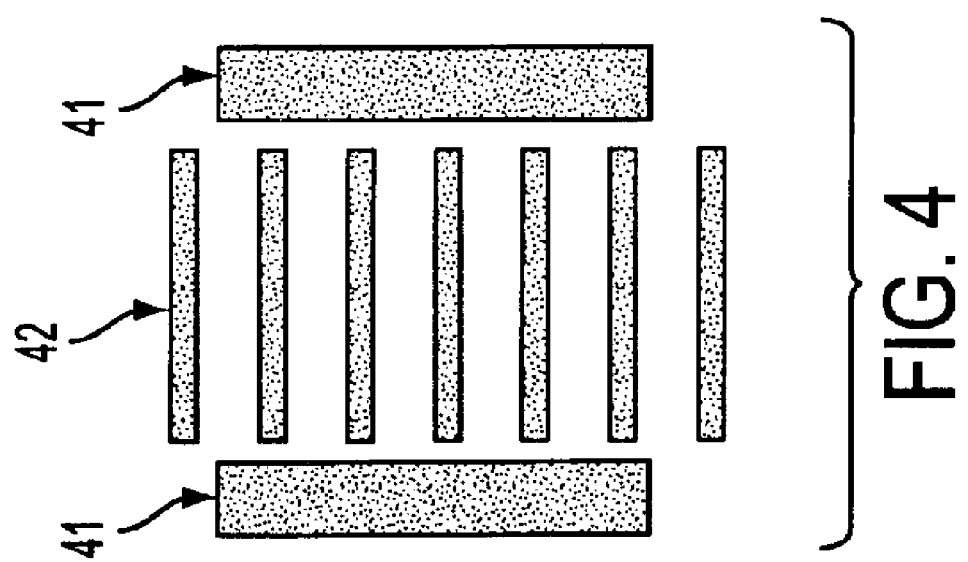

OPTICAL PROXIMITY CORRECTION METHOD UTILIZING RULED LADDER BARS AS SUB-RESOLUTION ASSIST FEATURES

RELATED APPLICATIONS

The present application claims priority from U.S. Provisional Patent Application Ser. No. 60/275,723, filed Mar. 14, 2001, entitled "METHOD FOR OPTICAL PROXIMITY CORRECTION USING RULED LADDER BARS".

FIELD OF THE INVENTION

The present invention relates to photolithography, and in particular to the design and generation of a photomask ("mask") having sub-resolution optical proximity correction ("OPC") features, which function to correct for optical proximity effects and increase the overall processing performance. The present invention also relates to the use of such a mask in a lithographic projection apparatus, which generally comprises:

- a radiation system for supplying a projection beam of radiation;
- a support structure for supporting patterning means (e.g., mask), the patterning means serving to pattern the projection beam according to a desired pattern;
- a substrate table for holding a substrate; and
- a projection system for projecting the patterned beam onto a target portion of the substrate.

BACKGROUND OF THE INVENTION

Lithographic apparatus can be used, for example, in the manufacture of integrated circuits (ICs). In such a case, the mask may contain a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In one type of lithographic projection apparatus, each target portion is irradiated by exposing the entire mask pattern onto the target portion in one go; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as described herein can be gleaned, for example, from U.S. Pat. No. 6,046,792, incorporated herein by reference.

In a manufacturing process using a lithographic projection apparatus, a mask pattern is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant. McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection systems, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441 and WO 98/40791, incorporated herein by reference.

The photolithographic masks referred to above comprise geometric patterns corresponding to the circuit components to be integrated onto a silicon wafer. The patterns used to create such masks are generated utilizing CAD (computer-aided design) programs, this process often being referred to as EDA (electronic design automation). Most CAD programs follow a set of predetermined design rules in order to create functional masks. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or the smallest space between two lines. Thus, the CD determines the overall size and density of the designed circuit.

Of course, one of the goals in integrated circuit fabrication is to faithfully reproduce the original circuit design on the wafer (via the mask). Another goal is to use as much of the semiconductor wafer real estate as possible. As the size of an integrated circuit is reduced and its density increases, however, the CD of its corresponding mask pattern approaches the resolution limit of the optical exposure tool. The resolution for an exposure tool is defined as the minimum feature that the exposure tool can repeatedly expose on the wafer. The resolution value of present exposure equipment often constrains the CD for many advanced IC circuit designs.

As the critical dimensions of the circuit layout become smaller and approach the resolution value of the exposure tool, the correspondence between the mask pattern and the actual circuit pattern developed on the photoresist layer can be significantly reduced. The degree and amount of differences in the mask and actual circuit patterns depends on the proximity of the circuit features to one another. Accordingly, pattern transference problems are referred to as "proximity effects."

To help overcome the significant problem of proximity effects, a number of techniques are used to add sub-lithographic features to mask patterns. Sub-lithographic features have dimensions less than the resolution of the exposure tool, and therefore do not transfer to the photoresist layer. Instead, sub-lithographic features interact with the original mask pattern and compensate for proximity effects, thereby improving the final transferred circuit pattern.

Examples of such sub-lithographic features are scattering bars and anti-scattering bars, such as disclosed in U.S. Pat. No. 5,821,014 (incorporated herein by reference), which are added to mask patterns to reduce differences between features within a mask pattern caused by proximity effects. More specifically, sub-resolution assist features, or scattering bars, have been used as a means to correct for optical proximity effects and have been shown to be effective for increasing the overall process window (i.e. the ability to consistently print features having a specified CD regardless of whether or not the features are isolated or densely packed relative to adjacent features). As set forth in the '014 patent, generally speaking, the optical proximity correction occurs by improving the depth of focus for the less dense to isolated features by placing scattering bars near these features. The scattering bars function to change the effective pattern density (of the isolated or less dense features) to be more dense, thereby negating the undesirable proximity effects associated with printing of isolated or less dense features. It is important, however, that the scattering bars themselves do not print on the wafer. Thus, this requires that the size of the scattering bars must be maintained below the resolution capability of the imaging system.

Accordingly, as the limits of optical lithography are being enhanced far into the sub-wavelength capability, assist features, such as scattering bars, must be made smaller and smaller so that the assist features remain below the resolution capability of the imaging system. However, as imaging systems move to smaller wavelengths and higher numerical apertures, the ability to manufacture the photomasks with sub-resolution scattering bars sufficiently small becomes a critical issue and a serious problem. Additionally, as the size of the scattering bars decrease, their ability to reduce proximity effects is reduced. Some of the problems arising with the use of scatter bars are due to the fact that the ability to include scatter bars in a design is limited, for example, by the space dimension between adjacent main features.

In addition, it has been determined by the inventor of the present application that benefits arise when assist features are positioned at frequencies that coincide with the harmonics of the frequency of the primary mask features. This implies that the assist features should be positioned at integer multiplies of the main feature frequency. For a single scatter bar solution, the scatter bar is typically placed midway between the main features. However, such placement presents a problem for dense features because the scatter bar cannot be made small enough to avoid printing. Furthermore, for semi-isolated features, the impact of a single scatter bar is generally insufficient, thereby requiring that multiple scatter bars be positioned in the space region between main features. In such instances, the desirable frequency solution is not practical as the separation between the outer scatter bars and the main feature is too small.

Accordingly, the typical solution is to place multiple scatter bars equally spaced within the space between main features. However, there are problems associated with such a solution. For example, the resulting frequency of the scatter bars is often beyond the imaging limits, thereby eliminating all but the effect of the zero diffraction order of the scatter bar. Further, if the scatter bars are placed at a frequency that matches that of the dense main features, there is an undesirable increase in the likelihood that the scatter bars will print when utilizing modified illumination techniques.

More specifically, as shown in FIG. 1, which is an illustration of the use of prior art scatter bars as an OPC assist feature, when multiple scatter bars 11 are placed within a space opening between main features 10, the frequency of the scatter bars is a function of the main feature space width rather than of the pitch. Although the scatter bar frequency does not coincide with that of the main features, it is generally beyond the diffraction limits of the imaging system. As a result, no first order diffraction energy is collected from the scatter bars, making the scatter bar frequency inconsequential. For example, referring to FIG. 1, which illustrates 150 nm main features with a line:space duty ratio of 1:5, using a 248 nm wavelength and a 0.70 NA objective lens, a scatter bar size of 60 nm placed on a 187.5 nm pitch will result in three evenly spaced scatter bars 11 between the main features 10. The resulting $k_1$ for the scatter bars, as defined by the resolution equation ($k_1$=pNA/2λ, where p equals pitch, NA equals the numerical aperture of the objective lens, and λ equals the exposure wavelength), equals 0.27, thereby effectively eliminating lens capture of the first diffraction orders when using σ values of 0.95 and below. With only zero diffraction order collection, the entire space between the main features experiences a reduction in intensity as a function of the bar width (b) and bar pitch ($p_b$):

$$\text{Space Reduction Intensity}=[(p_b-b)/p_b]^2=(0.68)^2=0.46 \quad (1)$$

This result is expected if the space transmission is equivalently reduced. Diffraction energy of the main features is reduced, resulting in an image with lower intensity which can allow for a mask exposure dose that more closely matches that of the other features on the mask. However, control of the intensity reduction at other values is difficult with multiple scatter bar assist features due to the constraints of the bar width and pitch values of the scatter bars.

Thus, there exists a need for a method of providing OPC assist features in a photomask which eliminates the foregoing problems associated with the use of multiple scatter bar OPC assist features.

SUMMARY OF THE INVENTION

Accordingly, it is an object of the present invention to provide a method of forming a photolithography mask having OPC assist features which allows for improved design flexibility and, in particular, improved control over the amount of space intensity reduction. In addition, it is an object of the present invention to provide OPC assist features capable of introducing a frequency component, which is substantially a harmonic of the frequency of the main features.

More specifically, in accordance with the present invention a photolithography mask is provided for optically transferring a pattern formed in the mask onto a substrate and for negating optical proximity effects. The mask includes a plurality of resolvable features to be printed on the substrate, where each of the plurality of resolvable features has a longitudinal axis extending in a first direction; and a pair of non-resolvable optical proximity correction features, referred to as ladder bars, disposed between two of the plurality of resolvable features, where the non-resolvable optical proximity correction features have a longitudinal axis extending in a second direction, wherein the first direction of the longitudinal axis of the plurality of resolvable features is orthogonal to the second direction of the longitudinal axis of the non-resolvable optical proximity correction features.

As explained in more detail below, the present invention provides significant advantages over known OPC assist features. For example, one of the significant advantages of the ladder bar assist features of the present invention is that they allow for the intensity reduction value to be easily and significantly varied in order to optimize imaging performance by simply varying the size of the ladder bars and the pitch of the ladder bars. This is possible, in part, because due to the orientation of the ladder bars relative to the main feature, the pitch and size of the ladder bars are no longer constrained by the space between the main features. In addition, by properly selecting the width of the groups of ladder bar assist features, it is possible to control an effective frequency component of the ladder bars along the axis of the main edges and between the main feature edges, and to minimize the increase in the magnitude of the second diffraction order component, thereby reducing the likelihood that the ladder bar assist features will print.

Additional advantages of the present invention will become apparent to those skilled in the art from the following detailed description of exemplary embodiments of the present invention.

Although specific reference may be made in this text to the use of the invention in the manufacture of ICs, it should be explicitly understood that the invention has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm).

The term mask as employed in this text may be broadly interpreted as referring to generic patterning means that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning means include:

a programmable mirror array. An example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. The required matrix addressing can be performed using suitable electronic means. More information on such mirror arrays can be gleaned, for example, from U.S. Pat. No. 5,296,891 and U.S. Pat. No. 5,523,193, which are incorporated herein by reference.

a programmable LCD array. An example of such a construction is given in U.S. Pat. No. 5,229,872, which is incorporated herein by reference.

The invention itself, together with further objects and advantages, can be better understood by reference to the following detailed description and the accompanying schematic drawings.

BRIEF DESCRIPTION OF THE DRAWINGS

FIG. 3 illustrates an exemplary mask utilizing a second embodiment of the ladder bar assist features of the present invention.

FIG. 4 illustrates an exemplary mask utilizing the ladder bar assist features of the present invention.

DETAILED DESCRIPTION OF THE INVENTION

In accordance with the optical proximity correction technique of the present invention, non-resolvable ladder bar assist features, each of which has a longitudinal axis which is substantially perpendicular to the longitudinal axis of the main features to be printed, are utilized as sub-resolution assist features. As explained in detail below the use of the ladder bar assist features of the present invention, among other things, allows for an improvement in design flexibility and, in particular, improved control over the amount of space intensity reduction and improved image control. In addition, it allows for control of an effective frequency component of the ladder bar assist features along the axis of the main feature edges and between the main feature edges.

Figure 1:
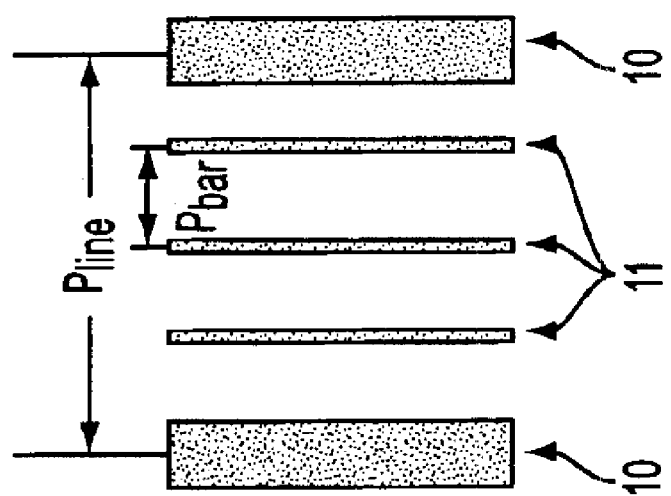
FIG. 1 illustrates an exemplary mask utilizing prior art assist features known as scatter bars.
Figure 2:
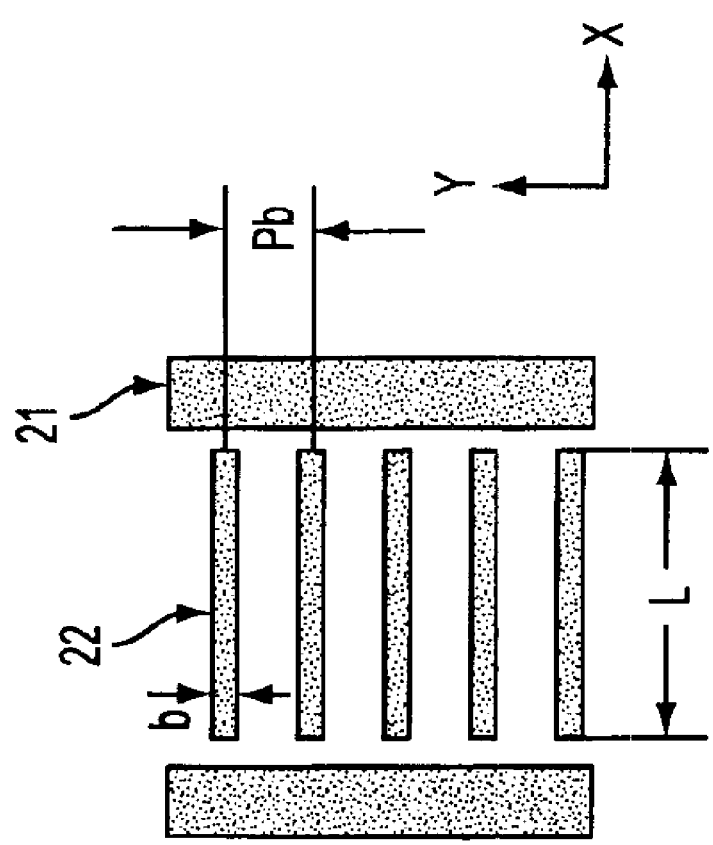
FIG. 2 illustrates an exemplary mask utilizing a first embodiment of the ladder bar assist features of the present invention.

FIG. 2 illustrates an exemplary mask utilizing a first embodiment of the ladder bar assist features (also referred to as ladder bars) of the present invention. Referring to FIG. 2, a plurality of ladder bar assist features 22 are placed between main features 21. Importantly, each of the ladder bar assist features 22 is positioned such that the longitudinal axis of the ladder bar assist feature 22 extends perpendicularly to the longitudinal axis of the main features 21. As shown, the ladder bar assist features 22 extend parallel to one another. In addition, the length of the ladder bar assist features of the given embodiment is such that the ladder bars 22 extend substantially the entire length of the space between the edges of the main features 21. In the embodiment illustrated in FIG. 2, the ladder bars 22 do not contact the edges of the main features 21. It is noted, however, that it is also possible for the ladder bars 22 to contact the edges of the main features.

Further, as with scatter bars, each ladder bar assist feature 22 is sub-resolution such that the ladder bar assist feature does not print. In other words, the size of each ladder bar assist feature (b) taken in consideration with the length of the ladder bar size (taken in the "X" direction) and the ladder bar pitch ($p_b$) must be such that the ladder bar assist features remain sub-resolution. In other words, the bar pitch must be beyond the resolution limits of the imaging tool, or below $\lambda/(\sigma+1)NA$, where $\lambda$ is the exposure wavelength, $\sigma$ is the partial coherence factor, and NA is the numerical aperture of the objective lens. The size of the ladder bar in the "Y" direction should remain small enough such that the ladder bar does not print yet large enough so as to result in a reduction in the space intensity as defined by equation (1) It is noted that the optimal settings and/or sizing of the ladder bar assist features for a given mask design can be determined by empirical methods and/or by simulation. It is further noted that ladder bar assist features can be opaque for use with dark line main features, or alternatively, transparent for use with clear space features.

The presence of the sub-resolution ladder bar assist features provides for the control of the main feature diffraction along the main feature edges, as well as the end of the main features. More specifically, by placing the ladder bar assist features 22 between the edges of the main features, the primary diffraction orders, namely, the zero diffraction order, the first diffraction order and the second diffraction order, can be determined utilizing the following equations:

$$\text{Mag. zero order} = [(p_b-b)/p_b](s/p) \quad (2)$$

$$\text{Mag. first order} = [(p_b-b)/p_b][(s/p)\text{sinc}(s/p)] \quad (3)$$

$$\text{Mag. second order} = [(p_b-b)/p_b][(s/p)\text{sinc}(2s/p)] \quad (4)$$

where s is the space (i.e., width) between main features 21, p is the pitch between main features, $p_b$ is the bar pitch (in the "Y" direction), and b is the bar size (in the "Y" direction). It is noted that the foregoing equations relate to the diffraction orders in the "X" direction, and presume that the width of the ladder bars is such that the bars extend across the entire opening in the "X" direction.

Figure 5B:
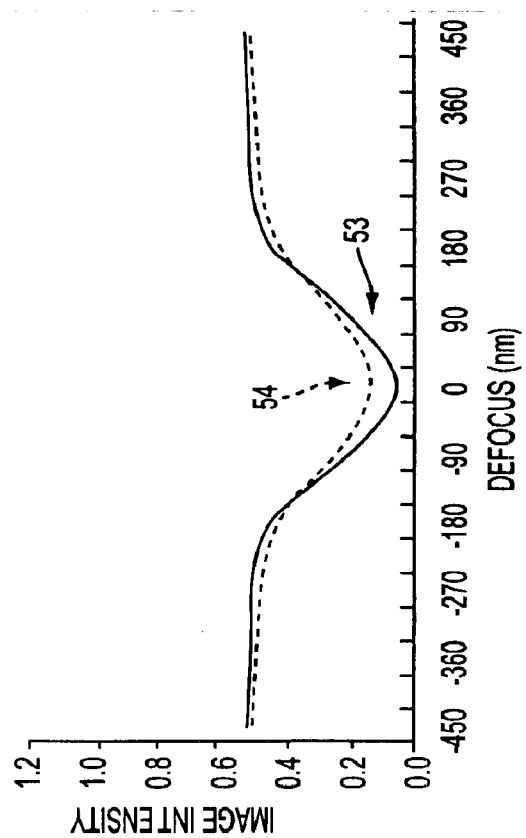
FIG. 5(b) is an aerial image of the same mask as utilized in FIG. 5(a), but modified to include the ladder bar assist features of the present invention.
Figure 5A:
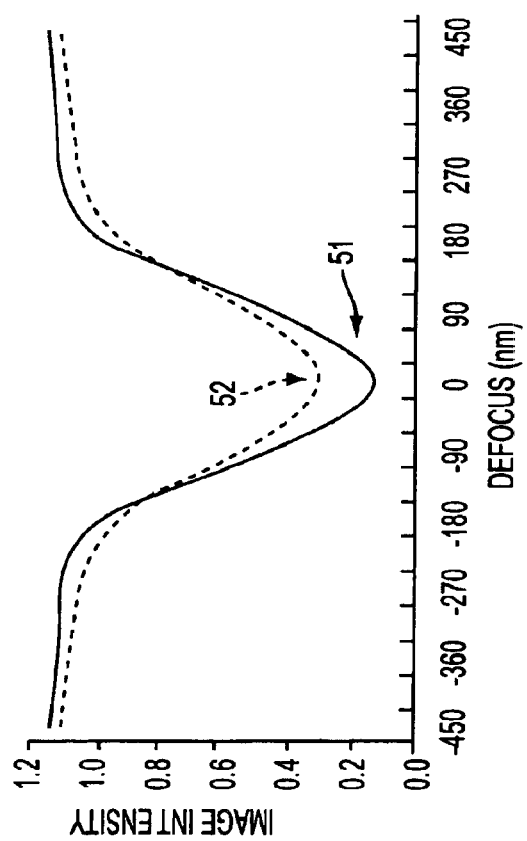
FIG. 5(a) illustrates an aerial image corresponding to a mask having no assist features.

FIG. 5(a) illustrates an aerial image corresponding to an exemplary mask having no OPC assist features, and FIG. 5(b) is an aerial image of the same mask as utilized in FIG. 5(a), but modified to include the ladder bar assist features of the present invention. Specifically, FIG. 5(a) illustrates the results of 150 nm main features having a 1:5 line:space duty ratio (semi-isolated features) being imaged utilizing a 248 nm wavelength ($\lambda$), a 0.70 lens pupil NA, and a partial coherence value ($\sigma$) of 0.85. The diffraction limited pitch of the illumination system is 192 nm. The images in FIG. 5(a) correspond to best focus (51) and 300 nm of defocus (52).

As shown in FIG. 5(a), the resulting isofocal inflection point is approximately 0.8, which is significantly larger than the value of the isofocal inflection point corresponding to mask features having a line:space duty ratio of 1:1 (for a 1:1 duty ratio, the resulting isofocal inflection point is on the order of 0.34). It is noted that the isofocal inflection point corresponds to the location at which the image prints with minimal loss regardless of whether the image is printed with substantially no defocus (i.e., best focus) or with 300 nm of defocus. Variations in the location of the isofocal inflection points associated with the dense and semi-isolated features make it difficult to print these features with a common process window. Accordingly, it is desirable to reduce the isofocal inflection point associated with semi-isolated features so as to improve the process overlap when such dense and semi-isolated features are included on the same mask.

FIG. 5(b) corresponds to the same mask as utilized to generate the image of FIG. 5(a), with the exception that the ladder bar assist features are added to the mask. The ladder bar assist features utilized have a size of 60 nm (dimension "b" in FIG. 2) and a pitch, $p_b$, of 185 nm. Further, the ladder bar assist features have a length such that the ladder bars extend across the entire space opening between the main features. As stated, as the diffraction limited pitch of the imaging system utilized for illumination is 192 nm, the pitch of the ladder bar assist features is sufficiently below the pitch limitation of the imaging system such that the ladder bar assist features do not print. The foregoing configuration/ dimensions of the ladder bar assist features result in the collection of only the zero diffraction order term due to the frequency of the ladder bar assist features. As such, utilizing equation (1) above, the resulting intensity reduction between the main features is $(0.676)^2$ or 46%.

It is noted that one of the significant advantages of the ladder bar assist features is that they allow for the intensity reduction value to be easily and significantly varied (for example, above and below the 46% value obtained in the present example) in order to optimize imaging performance by simply varying the size of the ladder bars and the pitch of the ladder bars. This is possible, in part, because due to the orientation of the ladder bars relative to the main feature, the pitch and size of the ladder bars are no longer constrained by the space between the main features. It is the length of the main feature (the "Y" direction in FIG. 2) that defines the number of ladder bars that can be included as OPC features. In contrast, the number of scatter bars that can be included between main features is limited by the space between the features, for conventional OPC and as a practical matter, it is becoming increasingly difficult to accommodate multiple scatter bars between main features while maintaining the scatter bars sub-resolution.

Returning again to FIG. 5(b), as shown, the use of the foregoing ladder bar assist features advantageously results in the reduction of the isofocal inflection point for the features having a line:space duty ratio of 1:5 to a value below 0.4, which is significantly closer to the isofocal inflection point of features having a 1:1 line: space duty ratio. As a result of the reduction of the location of the isofocal inflection point for the features having a line:space duty ratio of 1:5, it is possible to print these semi-isolated features and dense features with a common process window.

As mentioned above, it is also possible to utilize the ladder bar assist features of the present invention to control or correct optical proximity effects at the ends of the main features. This can be accomplished by controlling where the ladder bar assist feature is positioned relative to the end of the main features. FIG. 4 illustrates an exemplary mask utilizing the ladder bar assist features to compensate for line end shortening. As shown in FIG. 4, the ladder bar assist features 42 extend beyond the ends of the main features 41 so as to prevent the occurrence of line end shortening.

In accordance with a second embodiment of the present invention, the length of the ladder bar assist features disposed between the main features are variable. As explained in further detail below, by varying the length of the ladder bar assist features it is possible to introduce a frequency component associated with the ladder bar assist features that provides for additional image control.

FIG. 3 illustrates an exemplary mask utilizing the second embodiment of the ladder bar assist features of the present invention. As shown in FIG. 3, the ladder bar assist features 32 do not extend across the entire space between the main features 31, and the length of each of the ladder bar assist features is equal. As a result, the ladder bar assist features can be considered a group 33, which possesses a unique size and frequency when the group is repeatedly disposed between main features 31. FIG. 3 illustrates a single group 33 disposed between two main features 31. It is noted that the length of the ladder bar assist features determines the width of group 33.

By controlling the width of the group 33 it is possible to introduce a frequency component associated with the groups 33, which is preferably a harmonic of the frequency of the main features, that advantageously functions to reduce the zero order diffraction component, without a corresponding reduction in the first and second order diffraction components. As such, this additional frequency component allows for improved image control. In comparison, in the first embodiment of the present invention, in which the ladder bar assist features are disposed across substantially the entire space between the main features, no such frequency component is introduced along the main feature direction. Accordingly, in the first embodiment, a reduction of all diffraction orders occurs, as shown by equations (2), (3) and (4).

Figure 6:
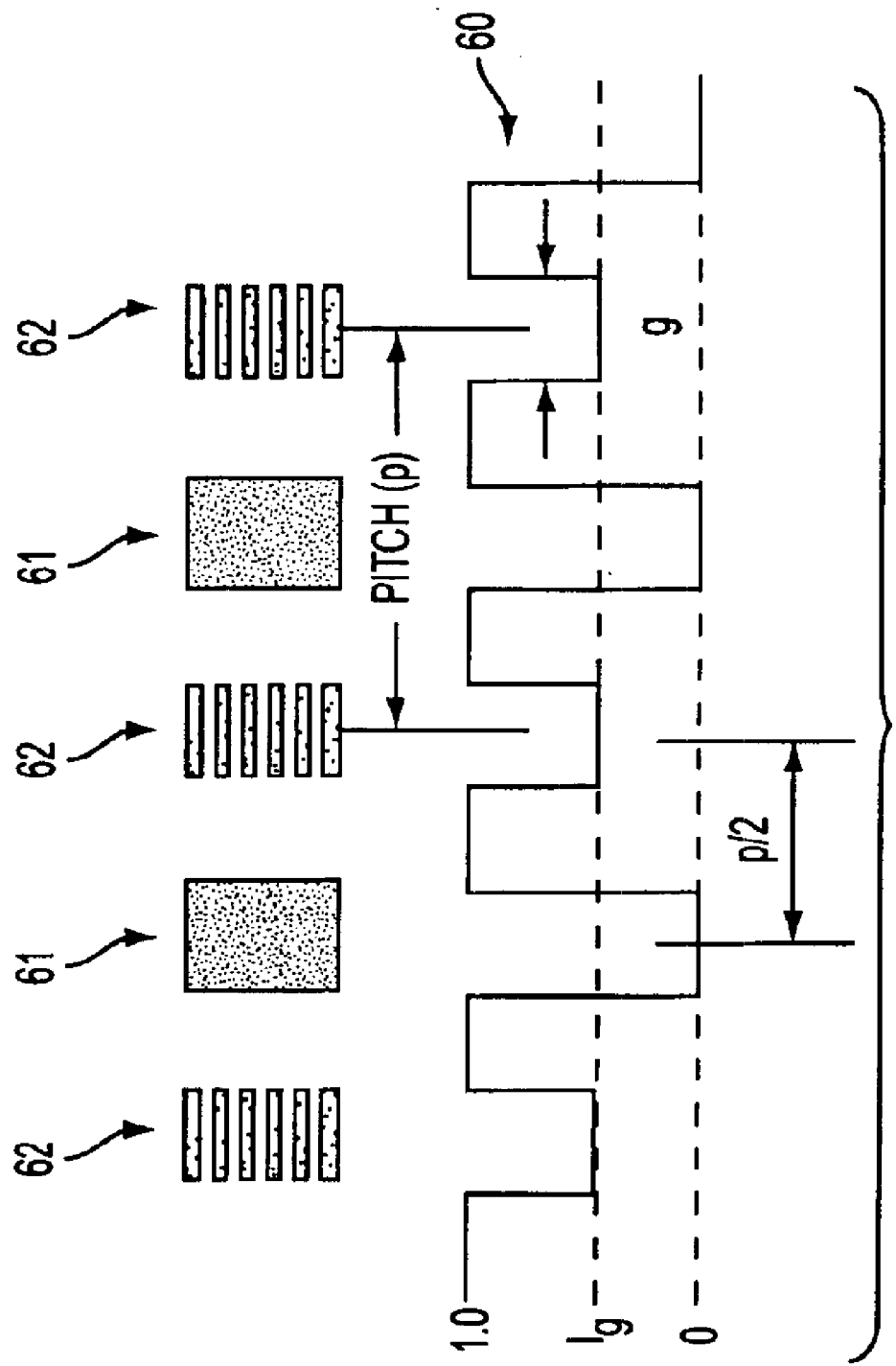
FIG. 6 illustrates an exemplary mask comprising the ladder bar assist features of the present invention.

The effect that the width of the ladder bar groups has on the magnitude of the zero, first and second order diffraction components is calculated for the exemplary mask illustrated in FIG. 6. Referring to FIG. 6, the mask electric field 60 is illustrated for main features 61 and the groups 62 of ladder bar assist features, one of which is disposed between each pair of main features 61. As stated, by introducing a ladder bar assist feature group 62 within the space between the mask features 61, the primary diffraction orders for the mask field are modified. Specifically, for opaque main features with clear openings, the magnitude of the primary diffraction orders become:

(5)    Mag. zero order = $[1-(g/s)(1-I_g)](s/p)$
(6)    Mag. first order = $|(s/p)\mathrm{sinc}(s/p)-(1-I_g)(g/p)\mathrm{sinc}(g/p)|$
(7)    Mag. second order = $|(s/p)\mathrm{sinc}(2s/p)-(1-I_g)(g/p)\mathrm{sinc}(2g/p)|$ where s is the main feature space width, p is the main feature pitch, g is the width of the ladder bar assist feature grouping, and $I_g$ is the resulting group intensity of the ladder bar assist feature group, which can be calculated utilizing equation (1) above.

Figure 7A:
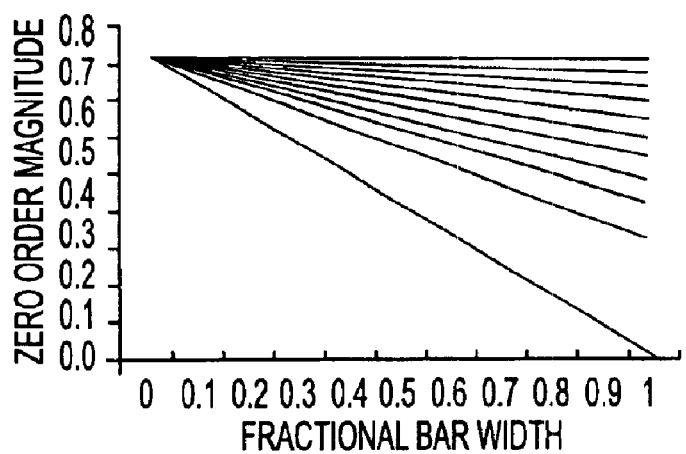
FIGS. 7(a)–7(c) illustrate how the primary diffraction orders (i.e., 0, 1st and 2nd) are influenced by the ladder bar assist features of the present invention.
Figure 7B:
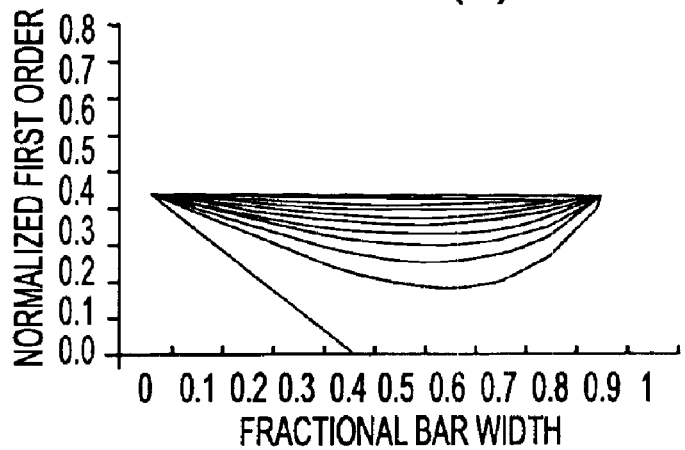
Figure 7C:
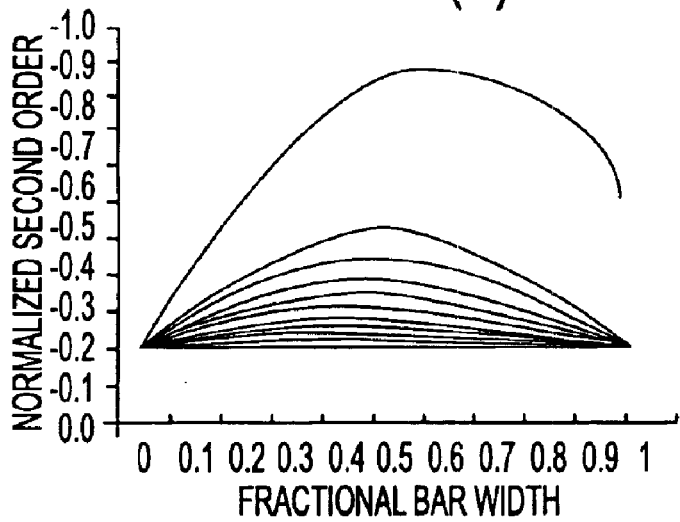

As can be seen from the foregoing equations, the modulation of the primary diffraction orders is unique and a function of the parameters of the grouped ladder bar assist features. FIGS. 7(a)–(c) illustrate how the primary diffraction orders are influenced by the grouped ladder bar assist features. Zero order magnitude values are plotted along with the first and second order magnitude values normalized to the resulting value of the zero order. The images illustrated in FIGS. 7(a)–(c) correspond to a mask comprising features having a 1:2.5 line:space duty ratio, with grouped ladder bar assist features having a width ranging from zero to substantially the entire space between the main features. A fractional width of zero implies no group ladder bar assist features are present and a width of 1 implies that ladder bar assist features occupy substantially the full space between the main features (as in the first embodiment of the present invention). In addition, in the given embodiment, the transmission value of the groups of ladder bar assist features are allowed to vary between 0% and 100% (i.e., no assist feature).

Referring to FIGS. 7(a)–7(c), it can be seen that for the case where the width of the ladder bar assist features occupy substantially the entire space between the main features as in the first embodiment (i.e., the right side of the plots in FIGS. 7(a)–7(c)), the normalized first and second order diffraction values remain the same. The left side of the plots of FIGS. 7(a)–7(c) correspond to the scatter bar solution, with zero transmission values and small fractional widths. It is noted that problems arise with scatter bar techniques as the size of the scatter bar increases and the magnitude of the second order diffraction component increases to the point where the scatter bar prints. It has been shown that a 0.3 width scatter bar will print in resist. A practical limit regarding the width of scatter bars is on the order of 0.15–0.2 fractional width. However, in contrast to scatter bars, as shown in FIG. 7(c), by adjusting the width of the grouped ladder bar assist features, the printability issues resulting from large second order effects can be reduced, thus making the use of the ladder bar assist features a viable solution. More specifically, as shown in FIG. 7(c), by properly selecting the width of the groups of ladder bar assist features 62, it is possible to minimize the increase in the magnitude of the second diffraction order component thereby reducing the likelihood that the ladder bar assist features will print.

Figure 8:
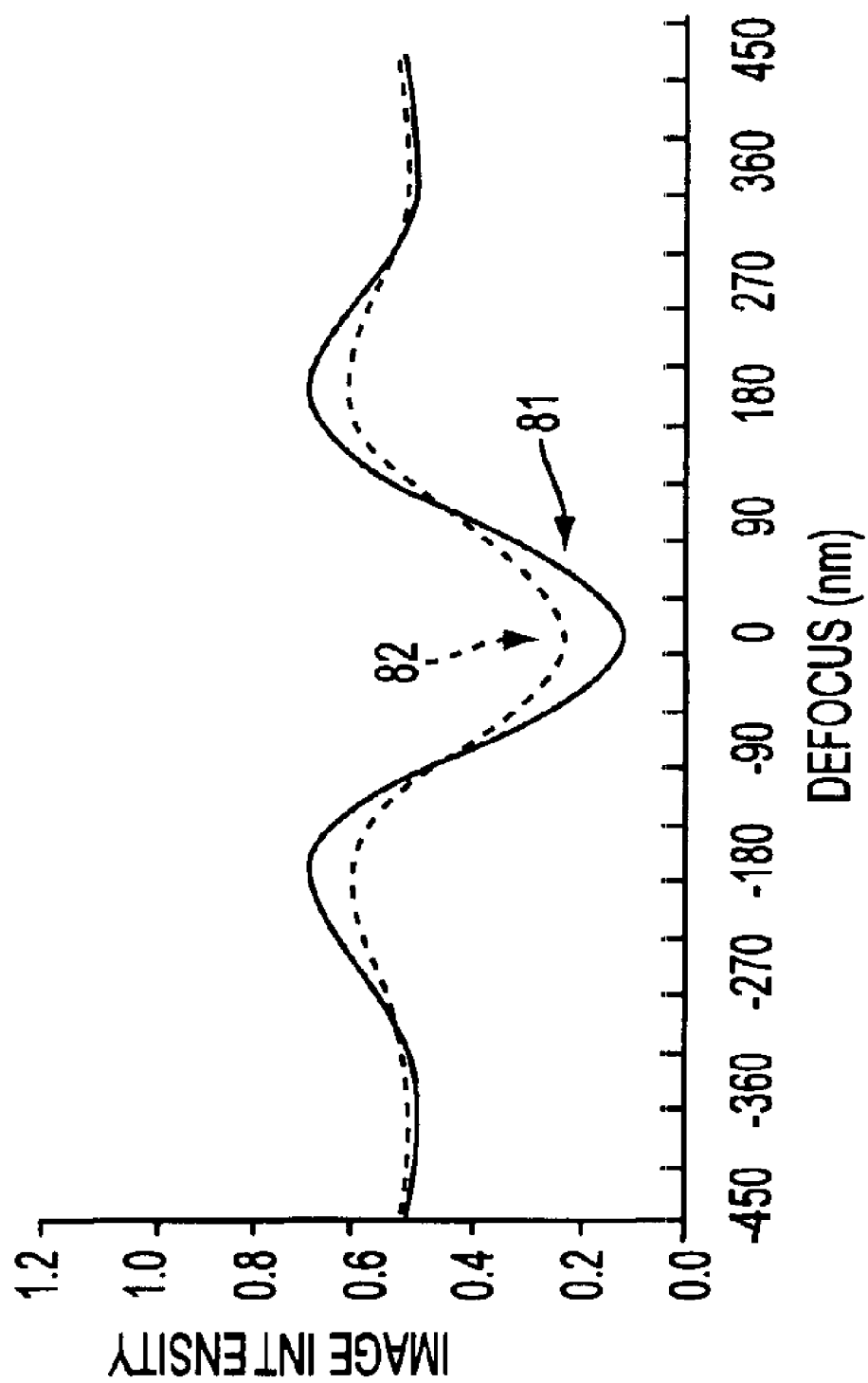
FIG. 8 is an aerial image illustrating the effect of a grouped ladder bar assist feature.

FIG. 8 is an aerial image illustrating the effect of a grouped ladder bar assist feature. The image illustrated corresponds to a mask comprising 150 nm features having a 1:5 line:space duty ratio, with grouped ladder bar assist features having a group width equal to ⅔ of the space width between the main features or 500 nm. Similar to the previous example, the pitch of the ladder bar assist features is 185 nm, which is sufficiently below the pitch limitation of the imaging system (i.e., the ladder bar assist features are sub-resolution), and the width size of the bar is 60 nm. The images of FIG. 8 correspond to an image taken at best focus 81 and an image taken at 300 nm of defocus 82. The configuration of the mask utilized to generate the images of FIG. 8 results in the collection of only the zero diffraction order of the ladder bar assist features within the group since their pitch is below the diffraction limits of resolution, resulting in an intensity reduction between the main features of $(0.78)^2$ or 0.61 or 61%. The foregoing is calculated utilizing equation (8) below:

$$\text{Space Reduction Intensity} = [((p_b-b)/p_b)(g/s)+(s-g)/s]^2 = 0.61 \quad (8)$$

where $p_b$ is the ladder bar pitch, b is the width of the ladder bar, s is the main feature space width, and g is the width of the ladder bar assist feature grouping. It is noted that one of the important aspects of the invention is that this transmission reduction value can be readily varied, either higher or lower, by adjusting the width of the group of the ladder bar assist features, or by adjusting the pitch and size of the ladder bar assist features.

When compared to the image set forth in FIG. 5(b), the results of the image set forth in FIG. 8 makes clear the significant improvement obtained by the utilizing the grouped ladder bar assist features having a variable width. More specifically, the image contrast for the best focused images in FIG. 5(b) is 0.37, while the image contrast for the image in FIG. 8 is 0.68, $$\text{Image Contrast} = (I\text{min} - I\text{max})/(I\text{min} + I\text{max}) \tag{9}$$

where Imin and Imax are the minimum and maximum intensities. It is noted that although the isofocal inflection point of the full space width ladder bar assist features of FIG. 5(b) is 0.78 and is lower than the value of the grouped ladder bar assist features of FIG. 8, which is 0.44, this is offset by the loss in image contrast. Importantly, by utilizing the grouped ladder bar assist features having varying width, it is possible to control this tradeoff, where a wider group can result in a lower isofocal intensity and a narrower group can result in larger contrast.

Figure 9:
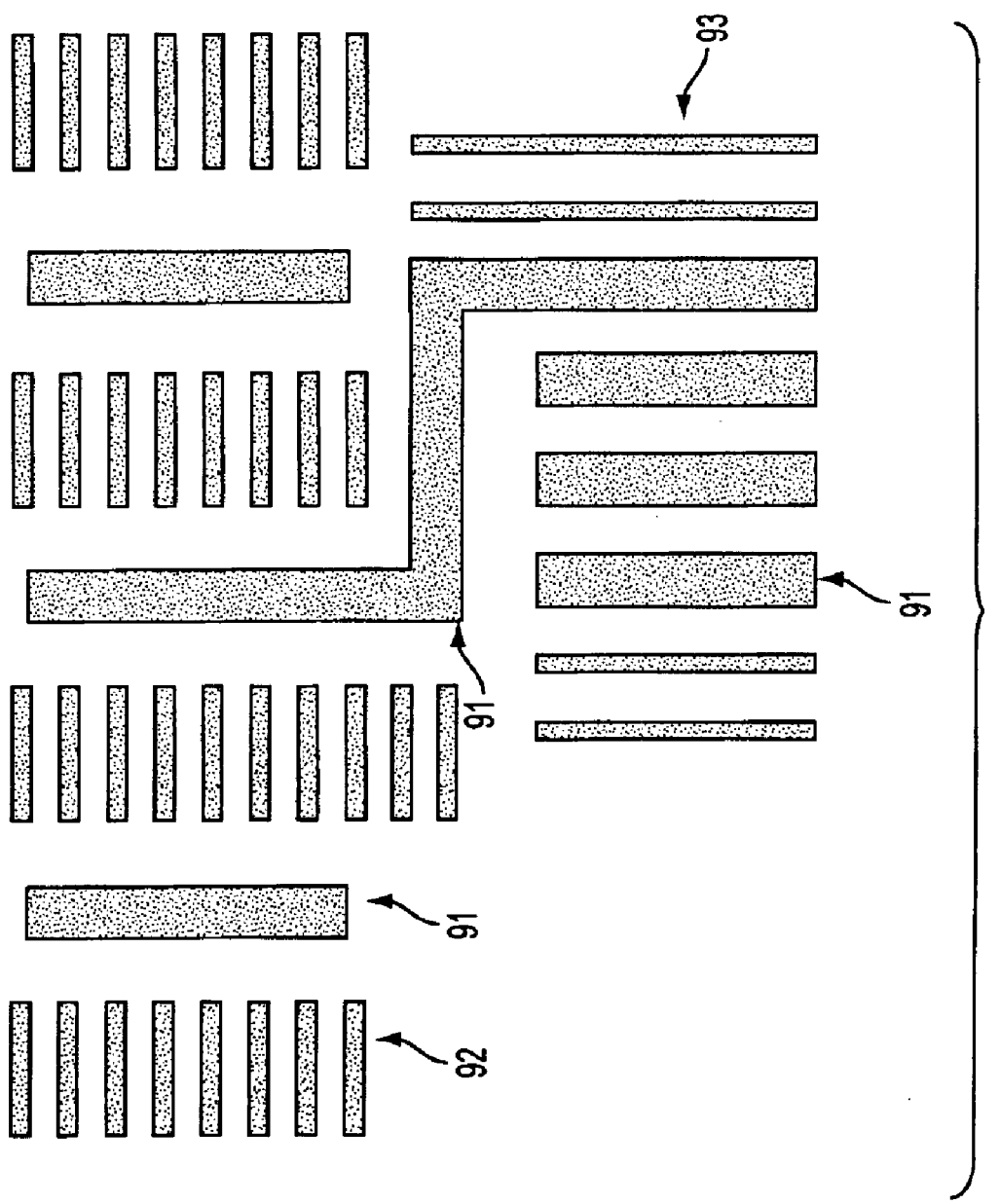
FIG. 9 illustrates an exemplary mask layout utilizing the ladder bar assist features of the present invention.

FIG. 9 illustrates an exemplary mask layout utilizing the ladder bar OPC assist features of the present invention. The mask layout illustrated in FIG. 9 represents a two dimensional application of mainline features 91, having groups of ladder bar assist features 92 disposed between the main line features 91. In addition, the exemplary mask also illustrates the use of prior art scatter bars 93. The use of such OPC correction features can provide significant improvement regarding process overlap across a variety of feature sizes and pitch values.

As noted above, the present invention provides significant advantages over known OPC assist features. For example, one of the significant advantages of the ladder bar assist features of the present invention is that they allow for the intensity reduction value to be easily and significantly varied in order to optimize imaging performance by simply varying the size of the ladder bars and the pitch of the ladder bars. This is possible, in part, because due to tile orientation of the ladder bars relative to the main feature, the pitch and size of the ladder bars are no longer constrained by the space between the main features. In addition, by properly selecting the width of the groups of ladder bar assist features, it is possible to minimize the increase in the magnitude of the second diffraction order component, thereby reducing the likelihood that the ladder bar assist feature will print.

It is further noted that numerous variations of the present invention are also possible. For example, the ladder bar assist features can be utilized with off-axis illumination techniques, such as quadrapole illumination. In addition, as noted above it is also possible to vary the transmission % of the ladder bar assist features so as to allow further optimization of the resulting image.

Figure 10:
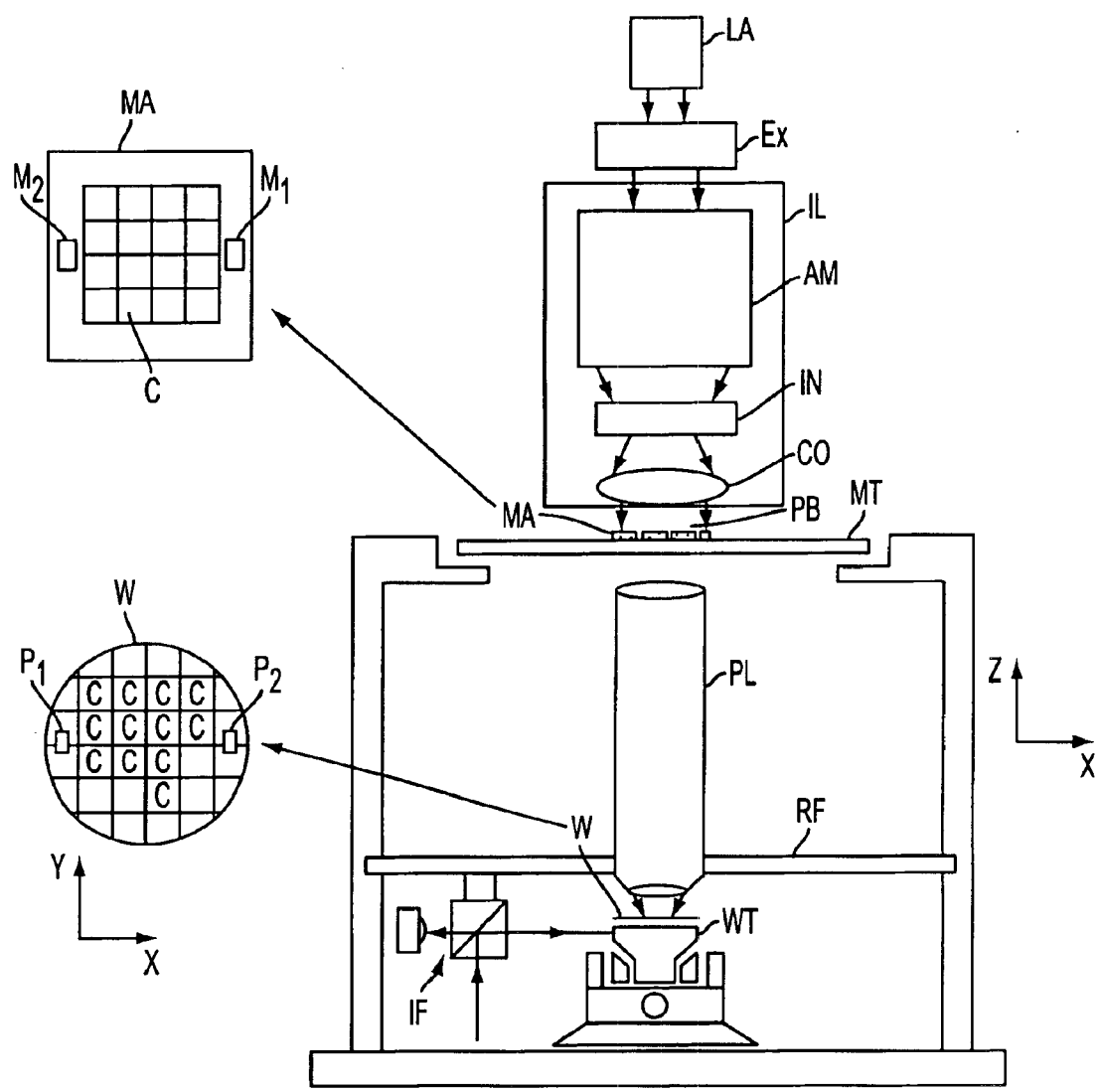
FIG. 10 schematically depicts a lithographic projection apparatus suitable for use with a mask designed with the aid of the current invention.

FIG. 10 schematically depicts a lithographic projection apparatus suitable for use with a mask designed with the aid of the current invention. The apparatus comprises:

- a radiation system Ex, IL, for supplying a projection beam PB of radiation. In this particular case, the radiation system also comprises a radiation source LA;
- a first object table (mask table) MT provided with a mask holder for holding a mask MA (e.g. a reticle), and connected to first positioning means for accurately positioning the mask with respect to item PL;
- a second object table (substrate table) WT provided with a substrate holder for holding a substrate W (e.g. a resist-coated silicon wafer), and connected to second positioning means for accurately positioning the substrate with respect to item PL;
- a projection system ("lens") PL (e.g. a refractive, catoptric or catadioptric optical system) for imaging an irradiated portion of the mask MA onto a target portion C (e g. comprising one or more dies) of the substrate W.

As depicted herein, the apparatus is of a transmissive type (i.e. has a transmissive mask). However, in general, it may also be of a reflective type, for example (with a reflective mask). Alternatively, the apparatus may employ another kind of patterning means as an alternative to the use of a mask; examples include a programmable mirror array or LCD matrix.

The source LA (e.g. a mercury lamp or excimer laser) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 10 that the source LA may be within the housing of the lithographic projection apparatus (as is often the case when the source LA is a mercury lamp, for example), but that it may also be remote from the lithographic projection apparatus, the radiation beam that it produces being led into the apparatus (e.g. with the aid of suitable directing mirrors); this latter scenario is often the case when the source LA is an excimer laser (e.g. based on KrF, ArF or $F_2$ lasing). The current invention encompasses both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF). the substrate table WT can be moved accurately, e.g. so as to position different target portions C in the path of the beam PB. Similarly, the first positioning means can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 10. However, in the case of a wafer stepper (as opposed to a step-and-scan tool) the mask table MT may just be connected to a short stroke actuator, or may be fixed.

The depicted tool can be used in two different modes:

In step mode, the mask table MT is kept essentially stationary, and an entire mask image is projected in one go (i.e. a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Although certain specific embodiments of the present invention have been disclosed, it is noted that the present invention may be embodied in other forms without departing from the spirit or essential characteristics thereof. The present embodiments are therefore to be considered in all respects as illustrative and not restrictive, the scope of the invention being indicated by the appended claims, and all changes that come within the meaning and range of equivalency of the claims are therefore intended to be embraced therein.

I claim:

1. A photolithography mask for optically transferring a pattern formed in said mask onto a substrate, said mask comprising:
    a plurality of resolvable features to be printed on said substrate, each of said plurality of resolvable features having a longitudinal axis extending in a first direction; and
    a pair of non-resolvable optical proximity correction features disposed between two of said plurality of resolvable features, said pair of non-resolvable optical proximity correction features having a longitudinal axis extending in a second direction,
    wherein said first direction of said longitudinal axis of said plurality of resolvable features is orthogonal to said second direction of said longitudinal axis of said pair of non-resolvable optical proximity correction features, and
    wherein said pair of non-resolvable optical proximity correction features have a length dimension which is substantially equal to the width of a space separating said two of said plurality of resolvable features.

2. The photolithography mask of claim 1, wherein said pair of non-resolvable optical proximity correction features do not contact said two of said plurality of resolvable features.

3. The photolithography mask of claim 2, wherein a plurality of pairs of said non-resolvable optical proximity correction features are disposed between said two of said plurality of resolvable features, each said pair of non-resolvable optical features having a longitudinal axis extending in a second direction.

4. The photolithography mask of claim 3, wherein said plurality of pairs of non-resolvable optical proximity correction features disposed between said two of said plurality of resolvable features all have substantially the same length, so as to form a single group of correction features.

5. The photolithography mask of claim 4, wherein said mask further comprises a plurality of said single group of correction features, each of said plurality of said single group of correction features being disposed between a given pair of said resolvable features.

6. The photolithography mask of claim 4, wherein said pairs of non-resolvable optical proximity correction features function to minimize the increase in a second order diffraction component of said resolvable features.

7. The photolithography mask of claim 5, wherein said groups of correction features have a frequency component which is substantially a harmonic of a frequency component of said plurality of resolvable features.

8. The photolithography mask of claim 4, wherein said pairs of non-resolvable optical proximity correction features function to reduce an isofocal inflection point associated with a given set of said resolvable features.

9. A computer program product for controlling a computer comprising a recording medium readable by the computer, means recorded on the recording medium for directing the computer to generate at least one file corresponding to a photolithography mask for optically transferring a pattern formed in said mask onto a substrate, said mask comprising:
    a plurality of resolvable features to be printed on said substrate, each of said plurality of resolvable features having a longitudinal axis extending in a first direction; and
    a pair of non-resolvable optical proximity correction features disposed between two of said plurality of resolvable features, said pair of non-resolvable optical proximity correction features having a longitudinal axis extending in a second direction,
    wherein said first direction of said longitudinal axis of said plurality of resolvable features is orthogonal to said second direction of said longitudinal axis of said pair of non-resolvable optical proximity correction features, and
    wherein said pair of non-resolvable optical proximity correction features have a length dimension which is substantially equal to the width of a space separating said two of said plurality of resolvable features.

10. The computer program product of claim 9, wherein each pair of said non-resolvable optical proximity correction features does not contact said two of said plurality of resolvable features.

11. The computer program product of claim 9, wherein a plurality of said pairs of non-resolvable optical proximity correction features are disposed between said two of said plurality of resolvable features, each said pair of non-resolvable optical features having a longitudinal axis extending in a second direction.

12. The computer program product of claim 11, wherein said plurality of pairs of said non-resolvable optical proximity correction features disposed between said two of said plurality of resolvable features all have substantially the same length, so as to form a single group of correction features.

13. The computer program product of claim 12, wherein said mask further comprises a plurality of said single group of correction features, each of said plurality of said single group of correction features being disposed between a given pair of said resolvable features.

14. The computer program product of claim 13, wherein said plurality of pairs of non-resolvable optical proximity correction features function to minimize the increase in a second order diffraction component of said resolvable features.

15. The computer program product of claim 13, wherein said groups of correction features have a frequency component which is substantially a harmonic of a frequency component of said plurality of resolvable features.

16. The computer program product of claim 13, wherein said plurality of pairs of non-resolvable optical proximity correction features function to reduce an isofocal inflection point associated with a given set of said resolvable features.

17. A method of transferring a lithographic pattern from a photolithography mask onto a substrate by use of a lithographic exposure apparatus, said method comprising the steps of:
    forming a plurality of resolvable features to be printed on said substrate, each of said plurality of resolvable features having a longitudinal axis extending in a first direction; and forming a pair of non-resolvable optical proximity correction features disposed between two of said plurality of resolvable features, said pair of non-resolvable optical proximity correction features having a longitudinal axis extending in a second direction, wherein said first direction of said longitudinal axis of said plurality of resolvable features is orthogonal to said second direction of said longitudinal axis of said pair of non-resolvable optical proximity correction features, and wherein said pair of non-resolvable optical proximity correction feature have a length dimension which is less than the width of a space separating said two of said plurality of resolvable features, said length of said pair of non-resolvable optical proximity correction being adjusted so as to minimize the increase in a second order diffraction component of said mask associated with said mask.

18. The method of claim 17, wherein a plurality of pairs of said non-resolvable optical proximity correction features are disposed between said two of said plurality of resolvable features, each pair of said non-resolvable optical features having a longitudinal axis extending in a second direction.

19. The method of claim 18, wherein said plurality of pairs of said non-resolvable optical proximity correction features disposed between said two of said plurality of resolvable features all have substantially the same length, so as to form a single group of correction features.

20. The method of claim 19, wherein mask further comprises a plurality of said single group of correction features, each of said plurality of said single group of correction features being disposed between a given pair of said resolvable features.

21. The method of claim 20, wherein said groups of correction features have frequency component which is substantially a harmonic of a frequency component of said plurality resolvable features.

22. The method of claim 19, wherein said pairs of non-resolvable optical proximity correction features function to reduce an isofocal inflection point associated with a given set of said resolvable features.

23. A device manufacturing method comprising the steps of:

(a) providing a substrate that is at least partially covered by a layer of radiation-sensitive material;

(b) providing a projection beam of radiation using a radiation system;

(c) using a pattern on a mask to endow the projection beam with a pattern in its cross-section;

(d) projecting the patterned beam of radiation onto a target portion of the layer of radiation-sensitive material, wherein, in step (c), use is made of a mask comprising:

a plurality of resolvable features to be printed on said substrate, each of said plurality of resolvable features having a longitudinal axis extending in a first direction; and a pair of non-resolvable optical proximity correction features disposed between two of said plurality of resolvable features, said pair of non-resolvable optical proximity correction features having a longitudinal axis extending in a second direction, wherein said first direction of said longitudinal axis of said plurality of resolvable features is orthogonal to said second direction of said longitudinal axis of said pair of non-resolvable optical proximity correction features, and wherein said pair of non-resolvable optical proximity correction features have a length dimension which is substantially equal to the width of a space separating said two of said plurality of resolvable features.

* * * * *